United States Patent
Cheng

(10) Patent No.: US 7,061,078 B2
(45) Date of Patent: Jun. 13, 2006

(54) SEMICONDUCTOR PACKAGE

(75) Inventor: Pai-Sheng Cheng, Tainan (TW)

(73) Assignee: Himax Technologies Inc., Tainan (TW)

( * ) Notice: Subject to any disclaimer, the term of this patent is extended or adjusted under 35 U.S.C. 154(b) by 82 days.

(21) Appl. No.: 10/978,327

(22) Filed: Nov. 1, 2004

(65) Prior Publication Data
US 2005/0098884 A1    May 12, 2005

(30) Foreign Application Priority Data
Nov. 6, 2003    (TW)    ................................ 92131150 A

(51) Int. Cl.
H01L 23/495    (2006.01)
(52) U.S. Cl. .................... 257/666; 257/737; 257/E23.1
(58) Field of Classification Search ................ 257/666, 257/737
See application file for complete search history.

(56) References Cited

U.S. PATENT DOCUMENTS 5,825,081 A * 10/1998 Hosomi et al. ............. 257/668
6,867,490 B1 * 3/2005 Toyosawa ................... 257/692

* cited by examiner

Primary Examiner—Roy Potter
(74) Attorney, Agent, or Firm—Thomas, Kayden, Horstemeyer & Risley

(57) ABSTRACT

A semiconductor package includes a chip and a carrier. The chip has an active surface and a lateral surface. The active surface has a number of first bumps and a number of second bumps. The first bumps are spaced by the second bumps. The first bumps are farther from the lateral surface than the second bumps are. The carrier has a base and a number of first inner leads. Each first inner lead has a body portion and a distal end bonding portion. The width of the body portion is smaller than that of the distal end bonding portion. The distal end bonding portions are electrically bonded to the first bumps such that the chip is disposed on the carrier, and each of the body portions is located between the two adjacent second bumps.

22 Claims, 7 Drawing Sheets

SEMICONDUCTOR PACKAGE

This application claims the benefit of Taiwan application Serial No. 92131150, filed Nov. 6, 2003, the subject matter of which is incorporated herein by reference.

BACKGROUND OF THE INVENTION

1. Field of the Invention

The invention relates in general to a semiconductor package, and more particularly to a semiconductor package having inner leads and bumps.

2. Description of the Related Art

In the process of packaging a chip into a tape carrier package (TCP) or chip on film (COF) package, the feature is that a tape carrier composed of an organic base is used to replace the conventional lead frame or substrate to serve as the foundation on which the chip is mounted. In addition, the package processes are made in a batch manner on a continuous tape row by tape automated bonding (TAB) process such that each chip is mounted on each tape carrier.

FIG. 1 is a top view showing a conventional semiconductor package. As shown in FIG. 1, the semiconductor package 10 is, for example, a TCP and includes a tape carrier 12 and a chip 14. The chip 14 has an active surface 14a and lateral surfaces 14b, 14c, 14d and 14e connected to the active surface 14a. The active surface 14a has several input/output (I/O) bonding pads (such as Al (aluminum) pads), on which first gold bumps 18 and second gold bumps 20 are covered. The first gold bumps 18 are spaced by the second gold bumps 20. For the first gold bumps 18 and the second gold bumps 20 adjacent to the individual lateral surface 14b, 14c, 14d or 14e, the first gold bumps 18 are farther from the adjacent lateral surface 14b, 14c, 14d or 14e than the second gold bumps 20 are.

The tape carrier 12 has a base 15, a cavity 16 for accommodating the chip 14, a number of first inner leads 22 and a number of second inner leads 24. It is to be noted that if the semiconductor package 10 is a COF package, the tape carrier 12 need not to have the cavity 16 and the chip 14 is directly disposed on the tape carrier 12. The cavity 16 is used for accommodating the chip 14. The first inner leads 22 are spaced by the second inner leads 24. The distal ends of the first inner leads 22 and the second inner leads 24 are exposed to the opening of the cavity 16 and electrically bonded to the first gold bumps 18 and the second gold bumps 20, respectively. The chip 14 is disposed on the tape carrier 12, and the chip 14 may be electrically connected to an external circuit via the first inner leads 22 and the second inner leads 24.

It is to be noted that the first bumps 18 and the second bumps 20 may be respectively bonded to the first inner leads 22 and the second inner leads 24 by inner lead bonding (ILB) process after the chip 14 is embedded into the cavity 16.

FIG. 2 is a partially enlarged schematic illustration showing the semiconductor package of FIG. 1. In FIG. 2, for example, the width of the first gold bump 18 equals the width of the second gold bump 20, and each of the first inner leads 22 and the second inner leads 24 has a longitudinal shape with a constant width. The width of the first inner lead 22 equals the width of the second inner lead 24, and the width of the first gold bump 18 is greater than that of the first inner lead 22. The pitch between the adjacent first gold bump 18 and the second gold bump 20 is A, and the width of each of the first gold bumps 18 and the second gold bumps 20 is B. The width of each of the first inner leads 22 and the second inner leads 24 is C, and the pitch between the adjacent first inner lead 22 and the second gold bump 20 is D. Of which, the value of D is equal to the result determined value of A-B/2-C/2. For example, the values of A, B and C are respectively 37, 36 and 20 micrometers (μm), and the value of D is 9 μm. That is, when the first gold bump 18 and the second gold bump 20 are respectively aligned with and bonded to the distal ends of the first inner lead 22 and the second inner lead 24, the pitch between the adjacent first inner lead 22 and the second gold bump 20 is 9 μm.

However, when the first gold bump 18 and the second gold bump 20 are respectively bonded to the distal ends of the first inner lead 22 and the second inner lead 24 in a misaligned manner, the first inner lead 22 tends to be electrically connected to the adjacent second gold bump 20 because the first inner lead 22 has the longitudinal shape with a constant width, and the pitch between the first inner lead 22 and the second gold bump 20 is very small. Thus, the serious short-circuited phenomenon, which greatly influences the electrical quality of the semiconductor package 10, may be caused.

SUMMARY OF THE INVENTION

It is therefore an object of the invention to provide a semiconductor package, which is configured such that the width of part of a first inner lead adjacent to a second bump is smaller than the width of the distal end of the first inner lead. Thus, it is possible to reduce the opportunity of electrical connection between the first inner lead and the second bump when the chip and the carrier are misaligned, to prevent the short-circuited phenomenon from being caused, and to maintain the electrical quality of the semiconductor package.

The invention achieves the above-identified object by providing a semiconductor package, which includes a chip and a carrier. The chip has an active surface and a lateral surface. The active surface has a number of first bumps and a number of second bumps. The first bumps are spaced by the second bumps. The first bumps are farther from the lateral surface than the second bumps are. The carrier has a base and a number of first inner leads. Each of the first inner leads has a body portion and a distal end bonding portion. The body portion has a width smaller than that of the distal end bonding portion. The distal end bonding portions are electrically bonded to the first bumps such that the chip is disposed on the carrier. Each of the body portions is located between the two adjacent second bumps.

The invention also achieves the above-identified object by providing a semiconductor package, which includes a chip and a carrier. The chip has an active surface and a lateral surface. The active surface has a number of first bumps and a number of second bumps. The first bumps are spaced by the second bumps. The first bumps are farther from the lateral surface than the second bumps are. The carrier has a base and a number of first inner leads. Each of the first inner leads has a distal end bonding portion. The distal end bonding portions are electrically bonded to the first bumps such that the chip is disposed on the carrier. Part of each of the inner leads located between the two adjacent second bumps has a width smaller than that of each of the distal end bonding portions.

The invention also achieves the above-identified object by providing a semiconductor package, which includes a chip and a carrier. The chip has an active surface and a lateral surface. The active surface has a number of first bumps and a number of second bumps. The first bumps are farther from the lateral surface than the second bumps are. The carrier has a base and a number of first inner leads. Each of the first inner leads has a distal end bonding portion. The distal end bonding portions are electrically bonded to the first bumps such that the chip is disposed on the carrier. Part of one of the first inner leads adjacent one of the second bumps has a width smaller than that of the distal end bonding portion of the one of the first inner leads.

In addition, one characteristic of the invention is that adjacent two of the first bumps are spaced by M of the second bumps, and M is an integer greater than 1.

Another characteristic of the invention is that adjacent two of the second bumps are spaced by N of the first bumps, and N is an integer greater than 1.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 3A:
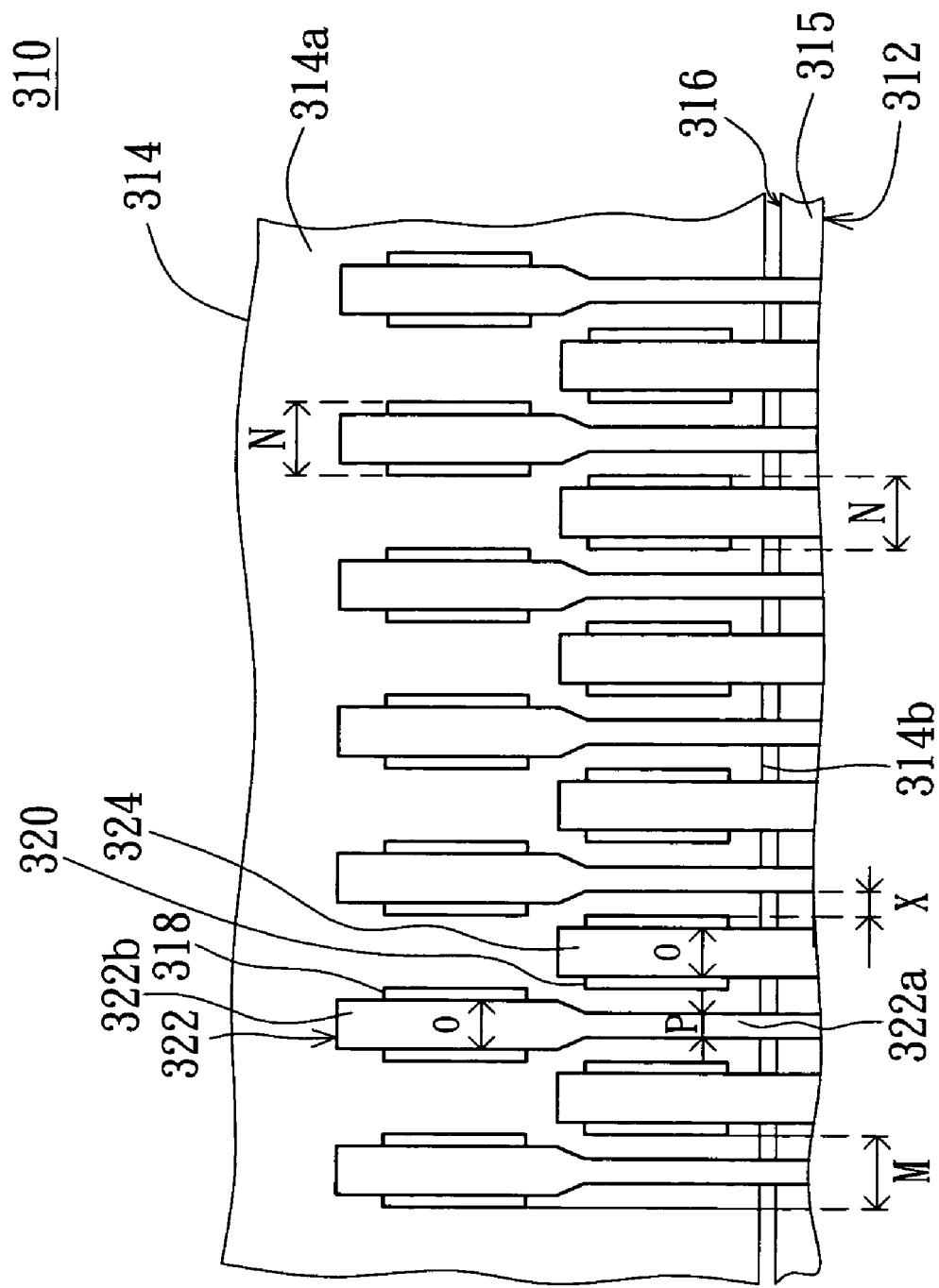
FIG. 3A is a partial top view showing a semiconductor package according to a first embodiment of the invention.

FIG. 3A is a partial top view showing a semiconductor package according to a first embodiment of the invention. As shown in FIG. 3A, the semiconductor package 310 is a tape carrier package (TCP), and includes a carrier 312 and a chip 314. The chip 314 has an active surface 314a and a lateral surface 314b connected to the active surface 314a. The active surface 314a has several first bumps 318 and several second bumps 320. The first bumps 318 are spaced by the second bumps 320. The first bumps 318 are farther from the lateral surface 314b than the second bumps 320 are. The carrier 312 has a base 315, a cavity 316 for accommodating for the chip 314, several first inner leads 322 and several second inner leads 324. The cavity 316 is used for accommodating the chip 314. The first inner leads 322 are spaced by the second inner leads 324.

The invention is characterized in that the first inner lead 322 has a body portion 322a and a distal end bonding portion 322b connected to the body portion 322a, and the width of the body portion 322a is smaller than that of the distal end bonding portion 322b. The distal end bonding portions 322b of the first inner leads 322 and the distal ends of the second inner leads 324 are exposed to the opening of the cavity 316, and to be electrically bonded to the first bumps 318 and the second bumps 320 respectively. The chip 314 is disposed in the cavity 316 of the carrier 312, and the body portion 322a of the first inner lead 322 is located between the two adjacent second bumps 320. The chip 314 may be electrically connected to an external circuit via the first inner leads 322 and the second inner leads 324.

In addition, the width of each of the first bump 318 may be greater than that of each of the distal end bonding portions 322b of the first inner leads 322, and the width of each of the second bumps 320 may be greater than that each of the distal ends of the second inner leads 324. The second inner lead 324 may have a longitudinal shape with a constant width, and the width of each of the second inner leads 324 is substantially equal to that each of the distal end bonding portions 322b of the first inner leads 322 so as to achieve the better performance. The configuration, however, does not intend to limit the implementation of the first embodiment.

Figure 1:
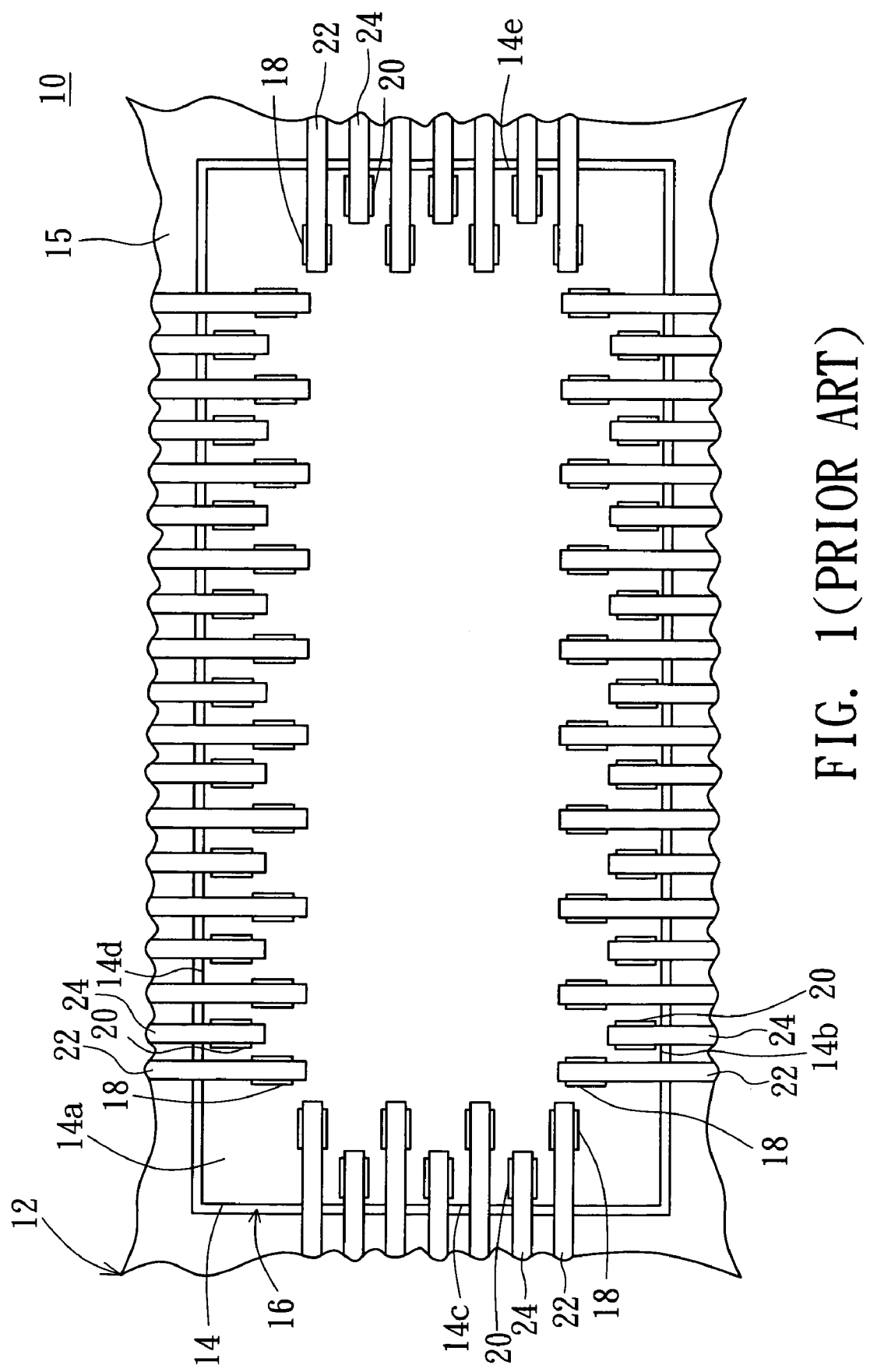
FIG. 1 (Prior Art) is a top view showing a conventional semiconductor package.
Figure 2:
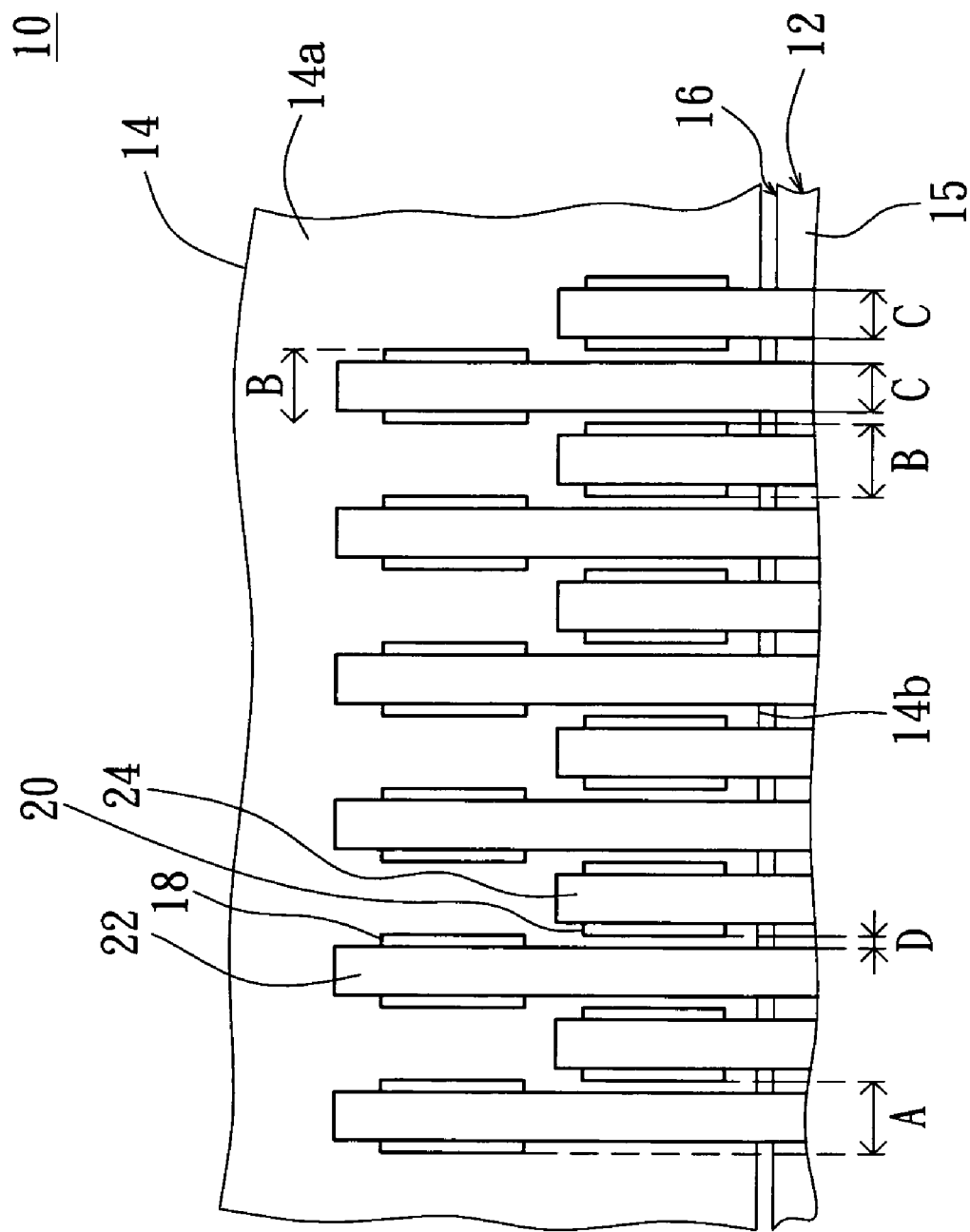
FIG. 2 (Prior Art) is a partially enlarged schematic illustration showing the semiconductor package of FIG. 1.

Please refer again to FIG. 3A. For example, the pitch between the adjacent first bump 318 and second bump 320 is M, the width of each of the first bumps 318 and the second bumps 320 is N, the width of each of the distal end bonding portion 322b of the first inner lead 322 and each of the second inner leads 324 are O, the width of each of the body portions 322a of the first inner leads 322 is P, and the pitch between the body portion 322a of the first inner lead 322 and the second bump 320 adjacent to the body portion 322a is X. Of which, the value of X is equal to the result determined value of M-N/2-P/2. For example, the values of M, N, O and P are respectively 37, 36, 20 and 8 micrometers (μm), and the value of X is 15 μm. That is, when the first bumps 318 and the second bumps 320 are aligned with and electrically bonded to the distal end bonding portions 322a of the first inner leads 322 and the distal end of the second inner leads 324 respectively, the pitch between the body portion 322a of the first inner lead 322 and the second bump 320 adjacent to the body inner lead 22 and the second bump 20 in the prior art of FIG. 2. It is to be noted that the width of the distal end bonding portion 322b of the first inner lead 322 of the invention is configured to match with the electrical connection effect with the first bump 318 and to match with the intensity of the eutectic structure or intermetallic structure.

Hence, the invention reduces the width of part of each of the first inner leads 322 that is not contacted to each of the first bumps 318. That is, the width of the structure exclusive of each of the distal end bonding portions 322b is smaller than the width of each of the distal end bonding portions 322b, so that the pitch between the first inner lead 322 and the adjacent second bump 320 is increased. Consequently, it is possible to reduce the opportunity of electrical connection between the first inner lead 322 and the adjacent second bump 320, to prevent the short-circuited phenomenon from being caused, and thus to maintain the electrical quality of the semiconductor package 310 when the chip 314 is electrically bonded to the carrier 312 in a misaligned manner.

Second Embodiment

Figure 3B:
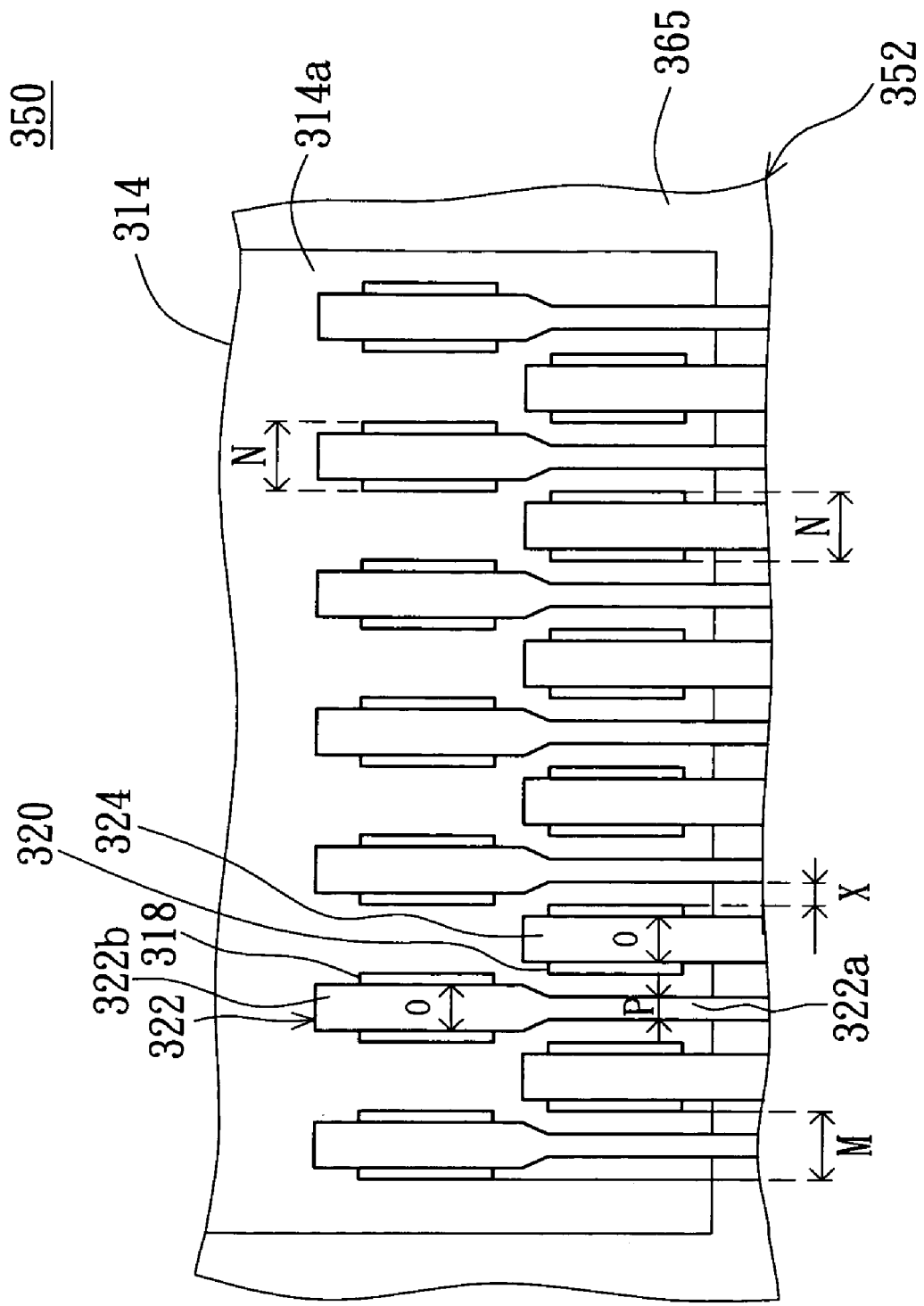
FIG. 3B is a partial top view showing a semiconductor package according to a second embodiment of the invention.

FIG. 3B is a partial top view showing a semiconductor package according to a second embodiment of the invention. As shown in FIG. 3B, the semiconductor package 350 is a COF package. The difference between the semiconductor package 350 of the second embodiment and the semiconductor package 310 of the first embodiment is that the carrier 352 of the semiconductor package 350 has no cavity but still has a base 365, several first inner leads 322 and several second inner leads 324. So, the chip 314 may be directly disposed on the carrier 352, and electrically bonded to the first inner leads 322 and the second inner leads 324. The same properties possessed in the semiconductor package 350 and the semiconductor package 310 of the first embodiment will not be described for the sake of simplicity.

Third Embodiment

Figure 4A:
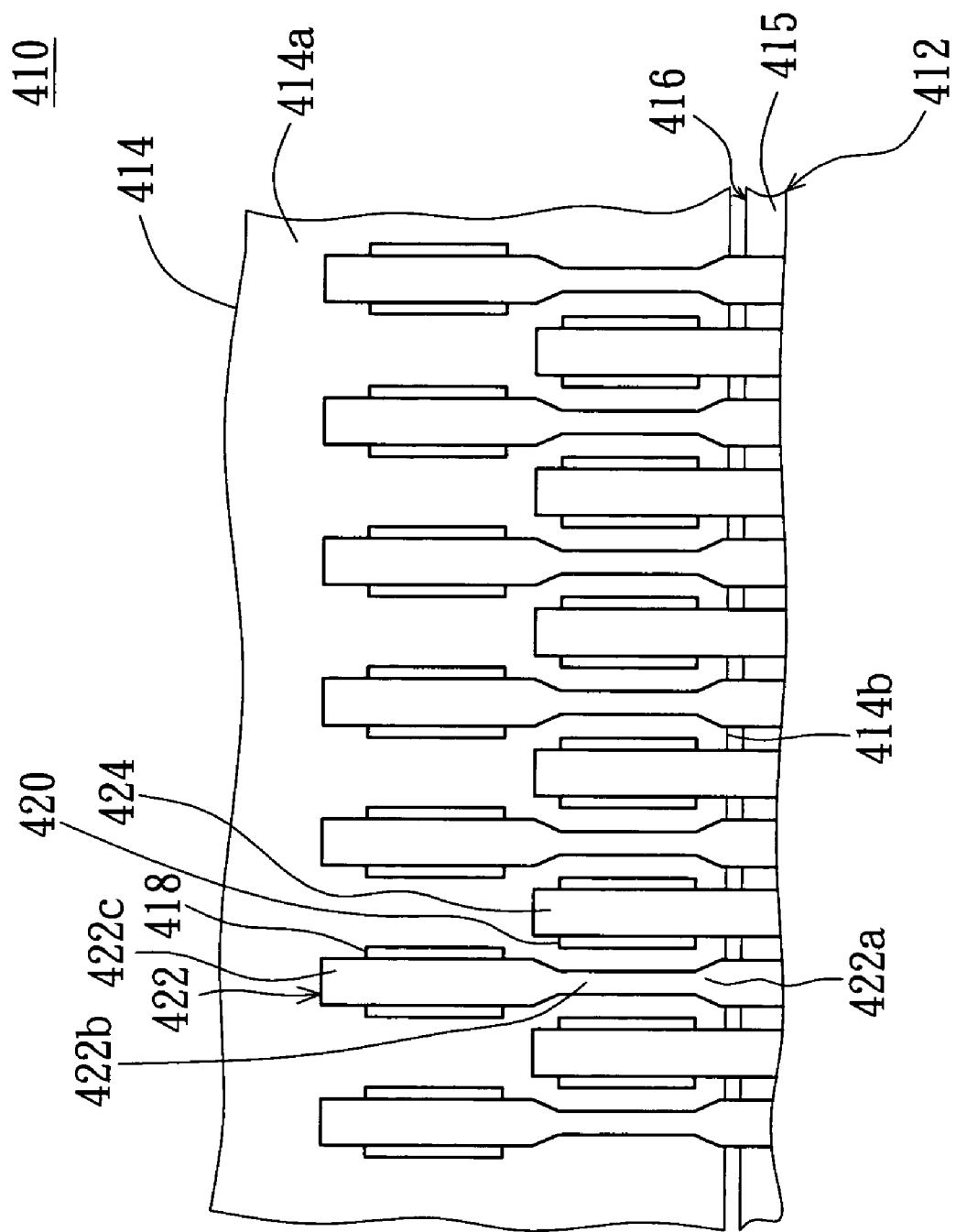
FIG. 4A is a partial top view showing a semiconductor package according to a third embodiment of the invention.

FIG. 4A is a partial top view showing a semiconductor package according to a third embodiment of the invention. As shown in FIG. 4A, the semiconductor package 410 is a TCP and includes a carrier 412 and a chip 414. The chip 414 has an active surface 414a and a lateral surface 414b connected to the active surface 414a. The active surface 414a has several first bumps 418 and several second bumps 420. The first bumps 418 are spaced by the second bumps 420. The second bumps 420 are located between the first bumps 418 and the lateral surface 414b. The carrier 412 has a base 415, a cavity 416, several first inner leads 422 and several second inner leads 424. The cavity 416 is used for accommodating the chip 414. The first inner leads 422 are spaced by the second inner leads 424.

The invention is characterized in that the first inner lead 422 has an extension potion 422a, a body portion 422b and a distal end bonding portion 422c. The body portion 422b is used for connecting the extension potion 422a and the distal end bonding portion 422c. The width of the body portion 422b is smaller than that of the distal end bonding portion 422c. The width of the extension potion 422a is greater than that of the body portion 422b. The width of the extension potion 422a equals that of the distal end bonding portion 422c. The distal end bonding portion 422c of the first inner lead 422 and the distal end of the second inner lead 424 are exposed to the opening of the cavity 416, and are to be electrically bonded to the first bump 418 and the second bump 420 respectively. The chip 414 is disposed in the cavity 416 of the carrier 412, and the body portion 422b of the first inner lead 422 is located between the two adjacent second bumps 420. The chip 414 may be electrically connected to an external circuit via the first inner leads 422 and the second inner leads 424.

In addition, the width of the first bump 418 may be greater than that of the distal end bonding portion 422c of the first inner lead 422, and the width of the second bump 420 may be greater than that of the distal end of the second inner lead 424. The second inner lead 424 may have a longitudinal shape with a constant width, and the width of the second inner lead 424 may equal that of the distal end bonding portion 422c of the first inner lead 422 so as to achieve the better performance in implementation. The configuration, however, does not intend to limit the implementation of the third embodiment. The pitch between the body portion 422b of the first inner lead 422 and the second bump 420 adjacent to the body portion 422b is greater than that between the first inner lead 22 and the second bump 20 of the prior art of FIG. 2. It is to be noted that the width of the distal end bonding portion 422c of the first inner lead 422 of the invention is configured to match with the electrical connection effect with the first bump 418 and to match with the intensity of the eutectic structure or intermetallic structure.

Hence, the invention reduces the width of the partial structure of the first inner lead 422 adjacent to the second bump 420 so as to reduce the opportunity of electrical connection between the first inner lead 422 and its adjacent second bump 420, to prevent the short-circuited phenomenon from being caused, and thus to maintain the electrical quality of the semiconductor package 410 when the chip 414 is bonded to the carrier 412 in a misaligned manner.

Fourth Embodiment

Figure 4B:
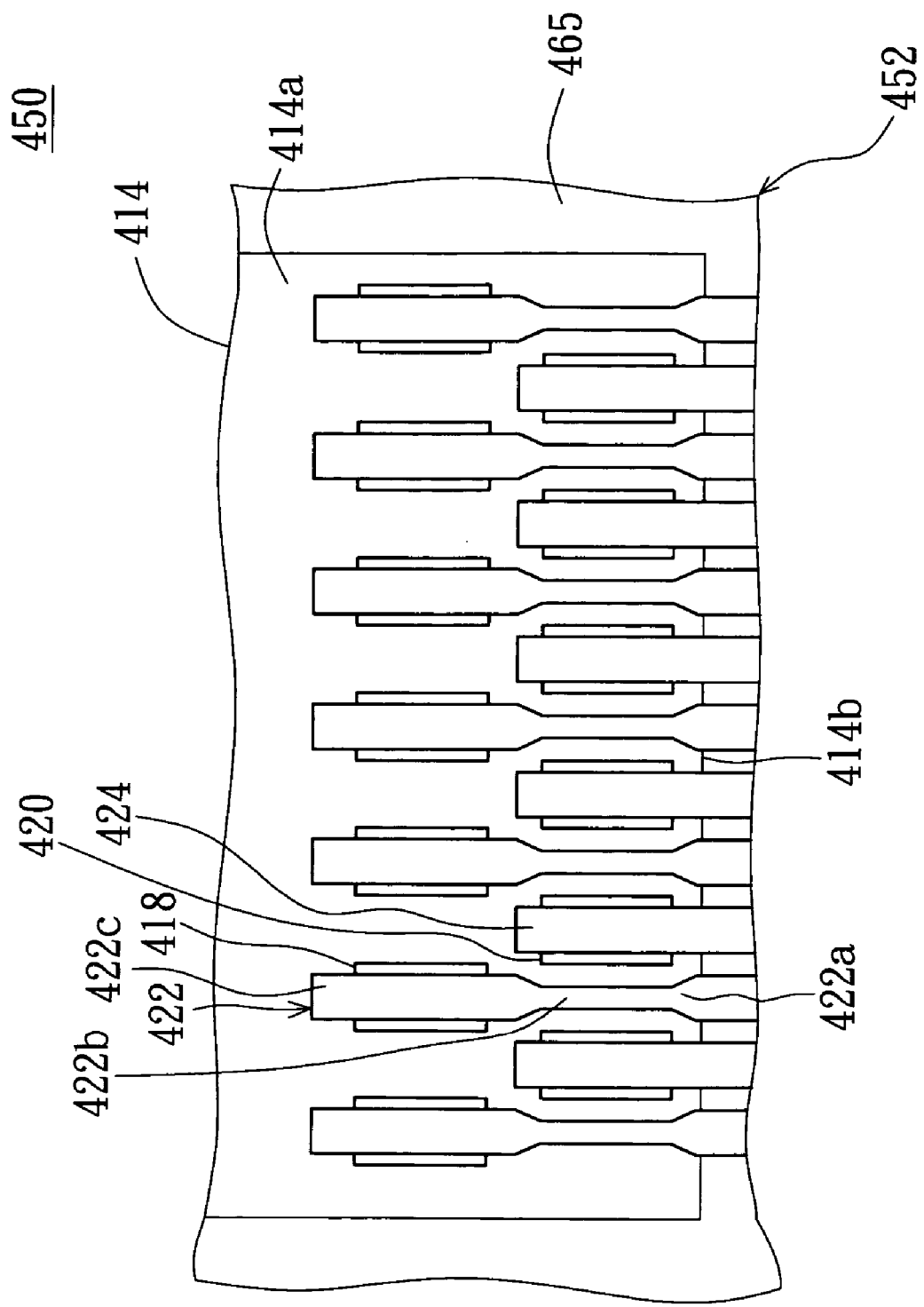
FIG. 4B is a partial top view showing a semiconductor package according to a fourth embodiment of the invention.

FIG. 4B is a partial top view showing a semiconductor package according to a fourth embodiment of the invention. As shown in FIG. 4B, the semiconductor package 450 is a COF package. The difference between the semiconductor package 450 of the fourth embodiment and the semiconductor package 410 of the third embodiment is that the carrier 452 of the semiconductor package 450 has no cavity but still has a base 465. Consequently, the chip 414 may be directly disposed on the carrier 452, and electrically bonded to the first inner leads 422 and the second inner leads 424. The same properties possessed in the semiconductor package 450 and the semiconductor package 410 of the third embodiment will not be described for the sake of simplicity.

Fifth Embodiment

Please refer FIGS. 3A–4B. Because two adjacent second bumps 320 may be not spaced by one first bump 318, but be spaced by more than one of the first bumps 318. Two adjacent first bumps 318 may be not spaced by one second bump 320, but be spaced by more than one of the second bumps 320. The structure exclusive of the distal end bonding portions 322b of the first inner lead 322 in FIG. 3A or the body portion 322b of the first inner lead 322 in FIG. 3B may not shrink on both lateral edges, but shrink on one lateral edge only. The same concept also can be applied to elements in FIG. 4A and FIG. 4B. Therefore, FIG. 5 is shown to illustrate the concept.

Figure 5:
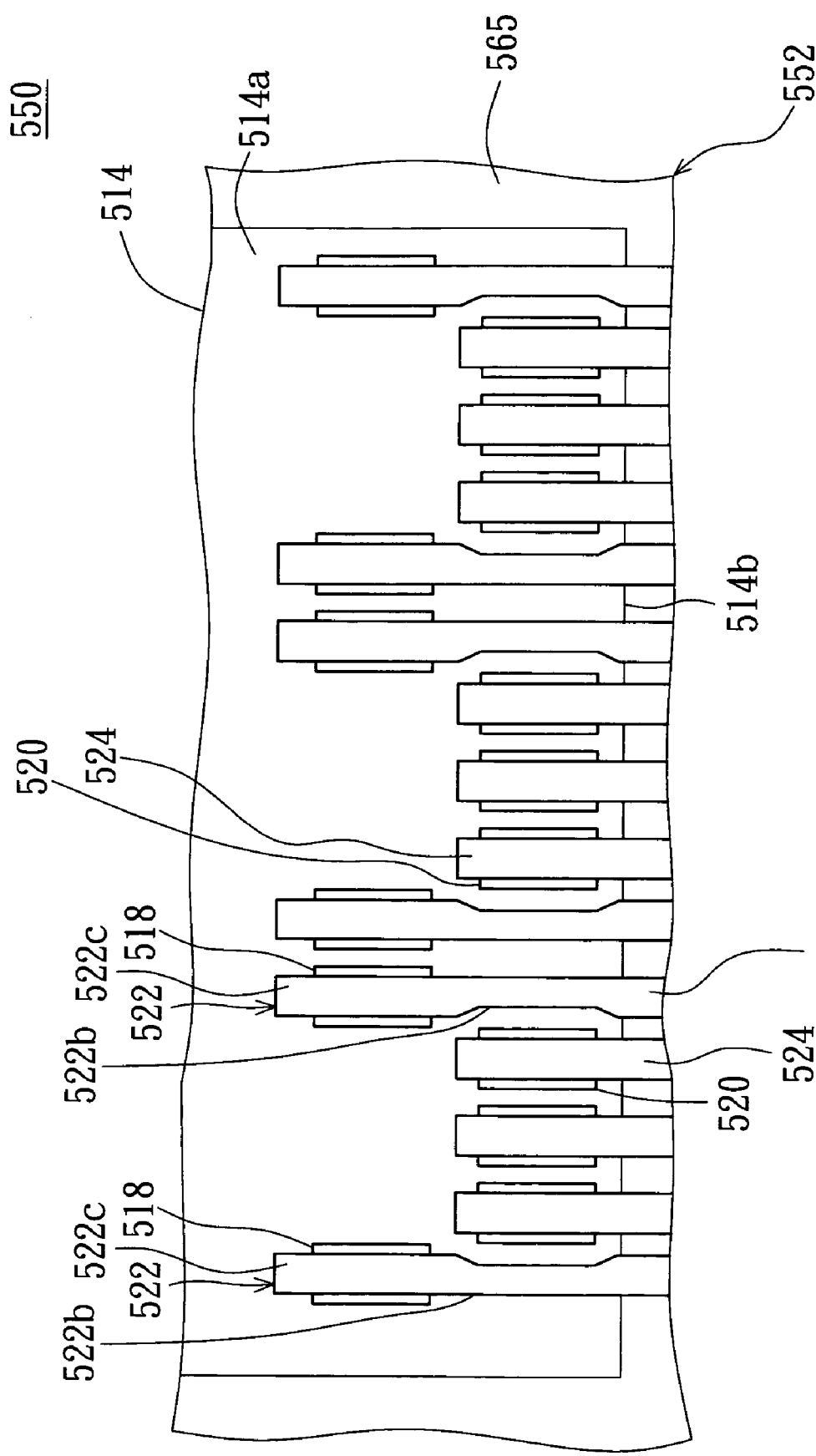
FIG. 5 is a partial top view showing a semiconductor package according to a fifth embodiment of the invention.

As shown in FIG. 5, the semiconductor package 550, maybe a COF package or TCP, includes a carrier 552 and a chip 514. The chip 514 has an active surface 514a and a lateral surface 514b connected to the active surface 514a. The active surface 514a has several first bumps 518 and several second bumps 520. The first bumps 518 are spaced by the second bumps 520. The first bumps 518 are farther from the lateral surface 514b than the second bumps 520 are. The carrier 552 has a base 565, several first inner leads 522 and several second inner leads 524. If the semiconductor package 550 is a TCP, the carrier 552 further has a cavity (not shown) for accommodating for the chip 514. If the semiconductor package 550 is a COF package, the chip 514 may be directly disposed on the carrier 552. The first inner leads 522 are spaced by the second inner leads 524.

The first inner lead 522 has an extension potion 522a, a body portion 522b and a distal end bonding portion 522c. The body portion 522b is used for connecting the extension potion 522a and the distal end bonding portion 522c. The width of the body portion 522b is smaller than that of the distal end bonding portion 522c. The distal end bonding portion 522c of the first inner lead 522 and the distal end of the second inner lead 524 are to be electrically bonded to the first bump 518 and the second bump 520 respectively. The chip 514 may be electrically connected to an external circuit via the first inner leads 522 and the second inner leads 524.

The difference between the semiconductor package 550 of the fifth embodiment and the semiconductor package 450 of the fourth embodiment is that two adjacent second bumps 520 may be spaced by more than one of the first bumps 518, such as two; two adjacent first bumps 518 may be spaced by more than one of the second bumps 520, such as three. That is, two adjacent second inner leads 524 may be spaced by two of the first inner leads 522, two adjacent first inner leads 522 may be spaced by three of the second inner leads 524. Besides, The width of the body portion 522b is smaller than that of the distal end bonding portion 522c by not shrinking on both lateral edges, but shrinking on one lateral edge only. The width of the extension potion 522a may selectively equal that of the distal end bonding portion 522c.

Hence, the invention reduces the width of the partial structure of the first inner lead 522 adjacent to the second bump 520 so as to reduce the opportunity of electrical connection between the first inner lead 522 and its adjacent second bump 520, to prevent the short-circuited phenomenon from being caused, and thus to maintain the electrical quality of the semiconductor package 550 when the chip 514 is bonded to the carrier 552 in a misaligned manner.

One of ordinary skill in the art may also understand that the invention is not limited to this technology. For instance, the first bumps may be several gold bumps, several solder bumps or several lead-free bumps. The second bumps also may be several gold bumps, several solder bumps or several lead-free bumps. In addition, the chip and the carrier are electrically bonded together by tape automated bonding (TAB) process, and the base may be, for example, the polyimide (PI).

In the semiconductor packages according to the embodiments of the invention, the width of a partial structure of a first inner lead adjacent to a first bump is smaller than the width of the distal end of the first inner lead. Thus, it is possible to reduce the opportunity of electrical connection between the first inner lead and the second bump when the chip and the carrier are misaligned, to prevent the short-circuited phenomenon from being caused, and thus to maintain the electrical quality of the semiconductor package.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
    a chip having an active surface and a lateral surface, wherein the active surface has a plurality of first bumps and a plurality of second bumps spaced by the first bumps, the first bumps are farther from the lateral surface than the second bumps are; and
    a carrier having a base and a plurality of first inner leads, wherein each of the first inner leads has a body portion and a distal end bonding portion, the body portion has a width smaller than that of the distal end bonding portion, the distal end bonding portions are electrically bonded to the first bumps such that the chip is disposed on the carrier, and each of the body portions is located between the two adjacent second bumps.

2. The semiconductor package according to claim 1, wherein a width of each of the first bumps is greater than that of the distal end bonding portion of each of the first inner leads.

3. The semiconductor package according to claim 1, wherein the carrier further has a plurality of second inner leads, the second inner leads are spaced by the first inner leads, and the distal ends of the second inner leads are electrically bonded to the second bumps.

4. The semiconductor package according to claim 3, wherein each of the second inner leads has a longitudinal shape with a constant width.

5. The semiconductor package according to claim 4, wherein a width of each of the second inner leads is substantially equal to that of the distal end bonding portion of each of the first inner leads.

6. The semiconductor package according to claim 1, wherein the first bumps are a plurality of first gold bumps and the second bumps are a plurality of second gold bumps.

7. The semiconductor package according to claim 1, wherein the first inner lead has an extension potion connected to the body portion, and the extension potion has a width greater than that of the body portion.

8. The semiconductor package according to claim 1, wherein the chip and the carrier are electrically bonded together by tape automated bonding (TAB) process.

9. The semiconductor package according to claim 1, wherein the semiconductor package is selected from the group consisting of a tape carrier package (TCP) and a chip on film (COF) package.

10. A semiconductor package, comprising:
    a chip having an active surface and a lateral surface, wherein the active surface has a plurality of first bumps and a plurality of second bumps spaced by the first bumps, the first bumps are farther from the lateral surface than the second bumps are; and
    a carrier having a base and a plurality of first inner leads, wherein each of the first inner leads has a distal end bonding portion for electrically bonding to the first bumps such that the chip is disposed on the carrier, part of each of the first inner leads located between the two adjacent second bumps has a width smaller than that of each of the distal end bonding portions.

11. The semiconductor package according to claim 10, wherein a width of each of the first bumps is greater than that of the distal end bonding portion.

12. The semiconductor package according to claim 10, wherein the carrier further has a plurality of second inner leads spaced by the first inner leads, and the distal ends of the second inner leads are electrically bonded to the second bumps.

13. The semiconductor package according to claim 12, wherein each of the second inner leads has a longitudinal shape with a constant width.

14. The semiconductor package according to claim 13, wherein the width of each of the second inner leads is substantially equal to that of each of the distal end bonding portions.

15. The semiconductor package according to claim 10, wherein the first bumps are a plurality of first gold bumps and the second bumps are a plurality of second gold bumps.

16. The semiconductor package according to claim 10, wherein the chip and the carrier are electrically bonded together by tape automated bonding (TAB) process.

17. The semiconductor package according to claim 10, wherein the semiconductor package is selected from the group consisting of a tape carrier package (TCP) and a chip on film (COF) package.

18. A semiconductor package, comprising:
    a chip having an active surface and a lateral surface, wherein the active surface has a plurality of first bumps and a plurality of second bumps, the first bumps are farther from the lateral surface than the second bumps are; and
    a carrier having a base and a plurality of first inner leads, wherein each of the first inner leads has a distal end bonding portion for electrically bonding to the first bumps such that the chip is disposed on the carrier, and wherein part of one of the first inner leads adjacent one of the second bumps has a width smaller than that of the distal end bonding portion of the one of the first inner leads.

19. The semiconductor package according to claim 18, wherein adjacent two of the first bumps are spaced by M of the second bumps, and M is an integer greater than 1.

20. The semiconductor package according to claim 18, wherein adjacent two of the second bumps are spaced by N of the first bumps, and N is an integer greater than 1.

21. The semiconductor package according to claim 18, wherein the part of the one of the first inner leads has a width smaller than other portion of the one of the first inner leads.

22. The semiconductor package according to claim 18, wherein the part of the one of the first inner leads shrinks on both lateral edges of the part.

* * * * *